US011355354B1

(12) United States Patent
Shen et al.

(10) Patent No.: US 11,355,354 B1
(45) Date of Patent: Jun. 7, 2022

(54) THERMAL DEPOSITION OF DOPED SILICON OXIDE

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Fremont, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/157,313

(22) Filed: Jan. 25, 2021

(51) Int. Cl.
*H01L 21/00* (2006.01)
*H01L 21/48* (2006.01)
*H01L 21/02* (2006.01)

(52) U.S. Cl.
CPC ........ *H01L 21/48* (2013.01); *H01L 21/02529* (2013.01); *H01L 21/02532* (2013.01); *H01L 21/02554* (2013.01)

(58) Field of Classification Search
CPC ............... H01L 21/48; H01L 21/02529; H01L 21/02532; H01L 21/02554
See application file for complete search history.

(56) References Cited

U.S. PATENT DOCUMENTS

2019/0385907 A1\* 12/2019 Gottheim .......... H01L 21/02115

\* cited by examiner

*Primary Examiner* — Jack S Chen

(74) *Attorney, Agent, or Firm* — Kilpatrick Townsend & Stockton LLP

(57) ABSTRACT

Exemplary methods of semiconductor processing may include providing a silicon-containing precursor and an oxygen-containing precursor to a processing region of a semiconductor processing chamber. A substrate may be disposed within the processing region of the semiconductor processing chamber. The methods may include providing a carbon-containing precursor to the processing region of the semiconductor processing chamber. The carbon-containing precursor may be characterized by a carbon-carbon double bond or a carbon-carbon triple bond. The methods may include thermally reacting the silicon-containing precursor, the oxygen-containing precursor, and the carbon-containing precursor at a temperature below about 650° C. The methods may include forming a silicon-and-oxygen-and-carbon-containing layer on the substrate.

20 Claims, 3 Drawing Sheets

THERMAL DEPOSITION OF DOPED SILICON OXIDE

TECHNICAL FIELD

The present technology relates to methods and components for semiconductor processing. More specifically, the present technology relates to systems and methods for producing dielectric films for semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, aspect ratios of structures may grow, and maintaining dimensions of these structures during processing operations may be challenged. Developing dielectric materials that may have sufficient conformality across features may be a challenge. Additionally, as the number of material layers being patterned during processing is expanding, producing materials that may have improved removal selectivity to other exposed materials is becoming a greater challenge, along with maintaining material properties.

Thus, there is a need for improved systems and methods that can be used to produce high quality devices and structures. These and other needs are addressed by the present technology.

SUMMARY

Exemplary methods of semiconductor processing may include providing a silicon-containing precursor and an oxygen-containing precursor to a processing region of a semiconductor processing chamber. A substrate may be disposed within the processing region of the semiconductor processing chamber. The methods may include providing a carbon-containing precursor to the processing region of the semiconductor processing chamber. The carbon-containing precursor may be characterized by a carbon-carbon double bond or a carbon-carbon triple bond. The methods may include thermally reacting the silicon-containing precursor, the oxygen-containing precursor, and the carbon-containing precursor at a temperature below about 650° C. The methods may include forming a silicon-and-oxygen-and-carbon-containing layer on the substrate.

In some embodiments, the processing region of the semiconductor processing chamber may be maintained plasma-free while forming the silicon-and-oxygen-and-carbon-containing layer on the substrate. The silicon-and-oxygen-and-carbon-containing layer may include or consist essentially of silicon, oxygen, carbon, and hydrogen. The substrate may be characterized by one or more features. The silicon-and-oxygen-and-carbon-containing layer may be formed about the one or more features with a conformality of greater than or about 90%. Thermally reacting the silicon-containing precursor, the oxygen-containing precursor, and the carbon-containing precursor may be performed at a temperature below or about 500° C. The silicon-and-oxygen-and-carbon-containing layer may be characterized by a carbon concentration of greater than or about 20%. The silicon-and-oxygen-and-carbon-containing layer may be characterized by a root-mean-square roughness of less than or about 0.4 nm. The silicon-and-oxygen-and-carbon-containing layer may be characterized by a leakage current at 2 MV/cm of less than or about 5E-9 A/cm$^2$. The methods may include exposing the silicon-and-oxygen-and-carbon-containing film to an anneal at a temperature of greater than or about 750° C. Subsequent the anneal, the silicon-and-oxygen-and-carbon-containing layer may maintain a dielectric constant of less than or about 4.2. The carbon-containing precursor may be provided at a flow rate ratio to the silicon-containing precursor of greater than or about 2:1. The oxygen-containing precursor may be provided at a flow rate ratio to the carbon-containing precursor of greater than or about 10:1.

Some embodiments of the present technology may encompass semiconductor processing methods. The methods may include providing a silicon-containing precursor and an oxygen-containing precursor to a processing region of a semiconductor processing chamber. A substrate may be disposed within the processing region of the semiconductor processing chamber. The methods may include providing a hydrocarbon to the processing region of the semiconductor processing chamber. The hydrocarbon may be characterized by a carbon-carbon double bond or a carbon-carbon triple bond. The methods may include thermally reacting the silicon-containing precursor, the oxygen-containing precursor, and the hydrocarbon at a temperature between about 400° C. and about 600° C. The methods may include forming a silicon-and-oxygen-and-carbon-containing layer on the substrate.

In some embodiments, the processing region of the semiconductor processing chamber may be maintained plasma-free during the semiconductor processing method. The methods may include exposing the silicon-and-oxygen-and-carbon-containing film to an anneal at a temperature of greater than or about 750° C. Subsequent the anneal, the silicon-and-oxygen-and-carbon-containing layer may maintain a dielectric constant of less than or about 4.2. The hydrocarbon may be provided at a flow rate ratio to the silicon-containing precursor of greater than or about 2:1. The substrate may be characterized by one or more features. The silicon-and-oxygen-and-carbon-containing layer may be formed about the one or more features with a conformality of greater than or about 90%.

Some embodiments of the present technology may encompass semiconductor processing methods. The methods may include providing a silicon-containing precursor and an oxygen-containing precursor to a processing region of a semiconductor processing chamber. A substrate may be disposed within the processing region of the semiconductor processing chamber. The oxygen-containing precursor may be provided at a flow rate ratio to the silicon-containing precursor of greater than or about 10:1. The methods may include providing a carbon-containing precursor to the processing region of the semiconductor processing chamber. The carbon-containing precursor may be characterized by a carbon-carbon double bond or a carbon-carbon triple bond. The methods may include thermally reacting the silicon-containing precursor, the oxygen-containing precursor, and the carbon-containing precursor at a temperature below about 600° C. The methods may include forming a silicon-and-oxygen-and-carbon-containing layer on the substrate. The silicon-and-oxygen-and-carbon-containing layer may include or consist essentially of silicon, oxygen, carbon, and hydrogen.

In some embodiments, the processing region of the semiconductor processing chamber may be maintained plasma-free while forming the silicon-and-oxygen-and-carbon-containing layer on the substrate. The silicon-and-oxygen-and-carbon-containing layer may be characterized by a thickness conformality of greater than or about 90%.

Such technology may provide numerous benefits over conventional systems and techniques. For example, embodiments of the present technology may produce conformal materials applicable to a number of substrate features. Additionally, the present technology may produce carbon-doped silicon oxide films with highly tunable film properties. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
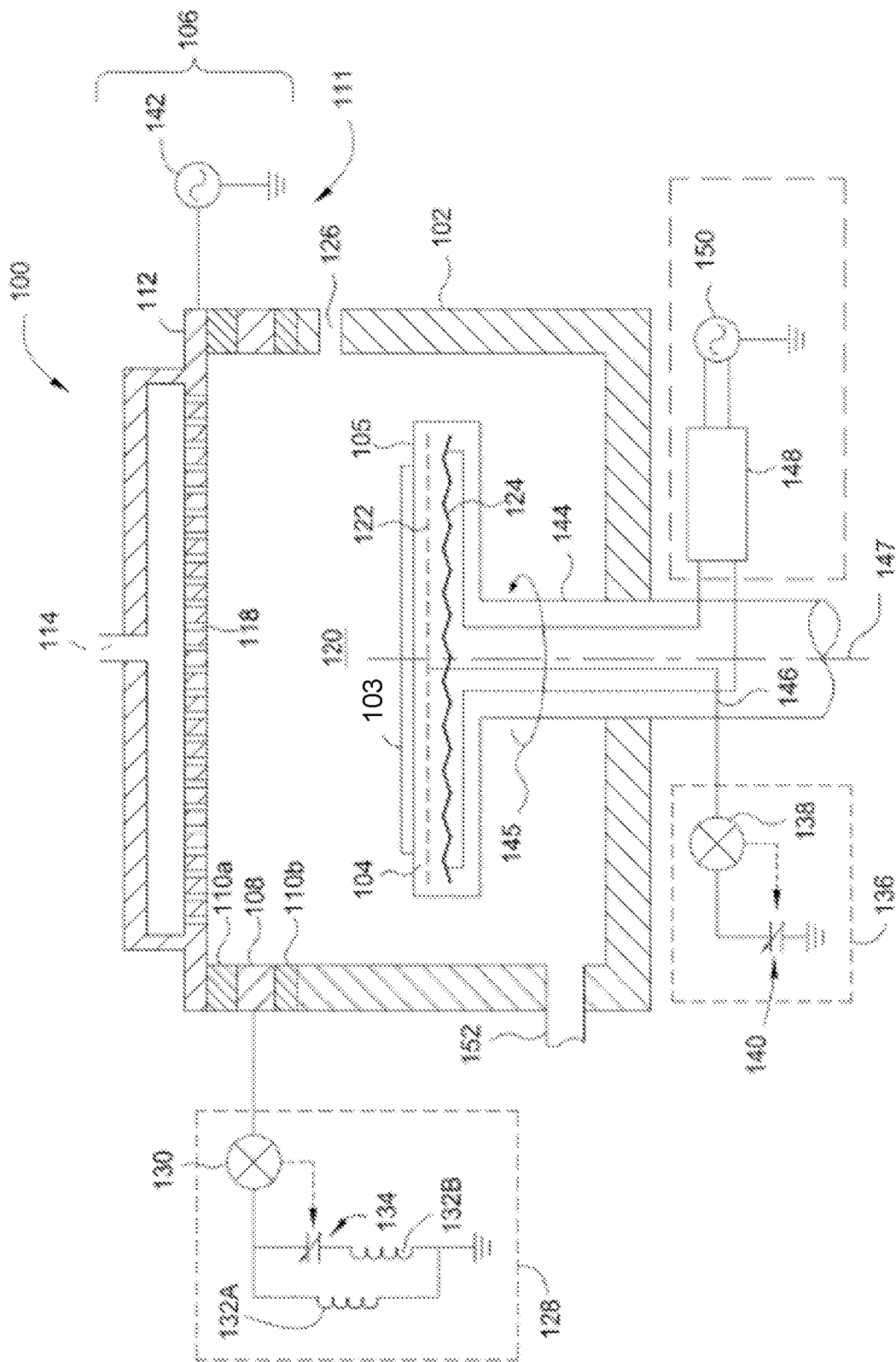
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. As structures are brought closer together within a device, dielectric materials may play an important role in limiting crosstalk and other electrical issues. Current materials may be incapable of sufficiently reduced dielectric constants without sacrificing material or electrical properties of the film. For example, by adjusting film properties to lower dielectric constant with some materials, the leakage characteristics of the material may increase and the breakdown properties of the film may reduce, which may lead to device failure. Additionally, for these films to be incorporated in semiconductor integration, processing may include a back-end-of-line anneal process that may expose structures to temperatures exceeding 600° C. or more. Many films may be impacted by this anneal, which can cause outgassing that may lead to increased dielectric constant.

Conventional technologies have struggled to produce films with sufficiently low dielectric constants that also maintain structural and electrical requirements. For example, many conventional techniques for producing carbon-doped oxide may utilize a single precursor having the silicon, oxygen, and carbon already incorporated, which may facilitate formation. However, these films may have worse conformality when deposited because the precursors often have increased hydrogen incorporation within the materials. The films may also be more likely to shrink during later processing operations, especially anneal operations. Some technologies may also perform an atomic-layer deposition type of formation, although these processes often utilize a precursor having nitrogen that gets incorporated within the film, and which can cause the dielectric constant to increase.

The present technology overcomes these issues by performing a thermally-based material deposition, which may not utilize plasma generation during the deposition process. By performing a thermal reaction between specific carbon-containing precursors and silicon/oxygen-containing precursors, the present technology may allow lower-temperature chemical-vapor deposition to be performed, which may provide conformal growth on any number of semiconductor structures. The process performed may allow increased tuning of the films being produced, affording films characterized by a variety of material properties for different applications.

Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
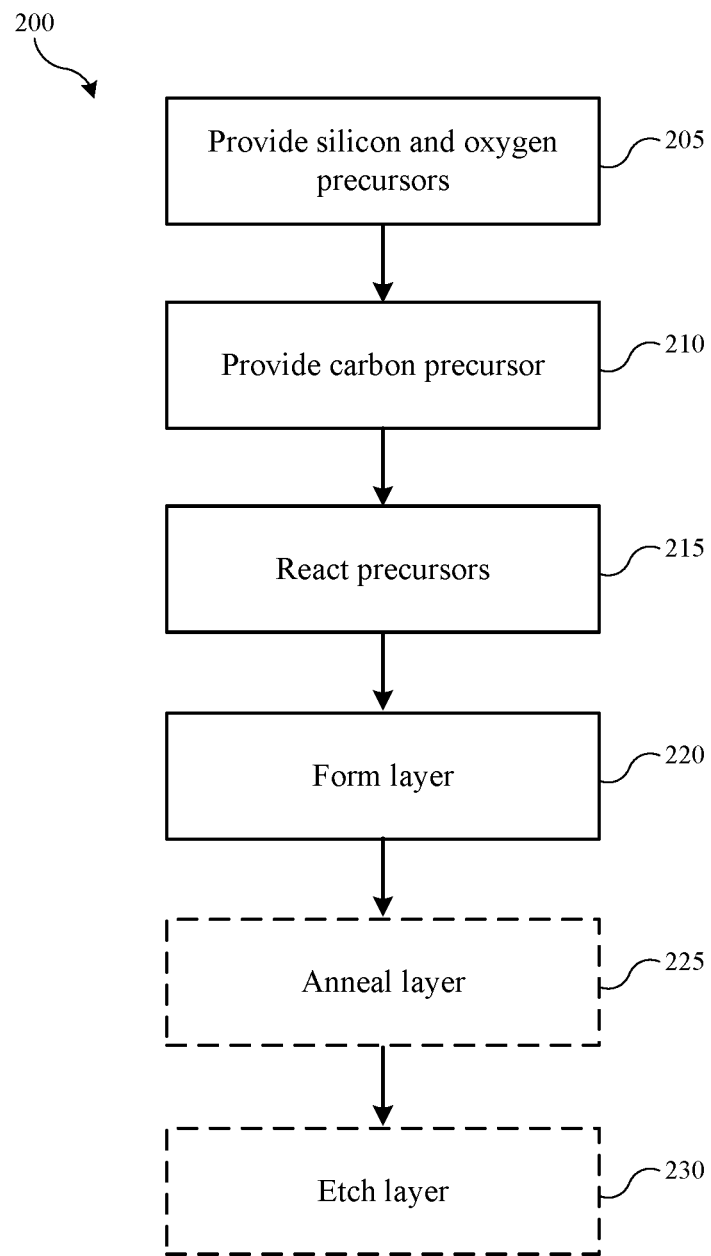
FIG. 2 shows operations in a semiconductor processing method according to some embodiments of the present technology.

As discussed previously, although a plasma-processing chamber may be used for one or more aspects of film processing, in some embodiments forming silicon, oxygen, and carbon films may not utilize a plasma-enhanced process, which may limit conformality of the film produced by further releasing carbon from precursors, and which may limit carbon incorporation in the films produced. The present technology may at least form the film without plasma generation in some embodiments. FIG. 2 shows exemplary operations in a processing method 200 according to some embodiments of the present technology. The method may be performed in a variety of processing chambers, including processing chamber 100 described above, as well as any other chambers including non-plasma chambers, in which the operations may be performed. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may include a processing method that may include a number of operations for developing a silicon-and-oxygen-containing film, which may include a tunable ratio of carbon within the film. As will be explained further below, modifying the ratios of silicon, oxygen, and carbon, as well as how the materials integrate within the film, may provide a number of properties to facilitate device processing for a number of structures.

At operation 205, the method may include providing a silicon-containing precursor and an oxygen-containing precursor to the processing region of a semiconductor processing chamber where a substrate may be housed. At operation 210, which may occur simultaneously with operation 205, as well as prior to or subsequent operation 205, a carbon-containing precursor may be provided to the processing region of the semiconductor processing chamber. At operation 215, the silicon-containing precursor, the oxygen-containing precursor, and the carbon-containing precursor may be thermally reacted within the processing region of the semiconductor processing chamber, which may form a silicon-and-oxygen-and-carbon-containing layer on the substrate at operation 220. Because of the reaction being performed in some embodiments, the semiconductor processing chamber, the pedestal, or the substrate may be maintained at a temperature below or about 650° C., and in some embodiments may be maintained at a temperature that is less than or about 600° C., less than or about 590° C., less than or about 580° C., less than or about 570° C., less than or about 560° C., less than or about 550° C., less than or about 540° C., less than or about 530° C., less than or about 520° C., less than or about 510° C., less than or about 500° C., less than or about 490° C., less than or about 480° C., less than or about 470° C., less than or about 460° C., less than or about 450° C., less than or about 440° C., less than or about 430° C., less than or about 420° C., less than or about 410° C., less than or about 400° C., or less.

As previously discussed, some or all of the formation operations may be performed while the substrate processing region is maintained plasma-free. By performing a thermal chemical-vapor deposition, a more conformal material formation may be produced. Non-limiting examples of silicon-containing precursors that may be used during processing according to some embodiments of the present technology may include silane, disilane, silicon tetrafluoride, silicon tetrachloride, dichlorosilane, tetraethyl orthosilicate, as well as any other silicon-containing precursors that may be used in silicon-containing film formation. Oxygen-containing precursors used in any operation as described throughout the present technology may include diatomic oxygen, nitrous oxide, nitrogen dioxide, ozone, as well as any other oxygen-containing precursors that may be used in silicon oxide film formation, although in some embodiments the oxygen-containing precursor may not include a hydroxyl moiety.

The carbon-containing precursor may be or include any number of carbon-containing precursors. For example, the carbon-containing precursor may be or include any hydrocarbon, or any material including or consisting of carbon and hydrogen. In some embodiments, to facilitate the reaction between the carbon precursor and the silicon or oxygen precursor, the carbon-containing precursor may be characterized by one or more carbon-carbon double bonds and/or one or more carbon-carbon triple bonds. Accordingly, in some embodiments the carbon-containing precursor may be or include an alkene or an alkyne, such as acetylene, ethylene, propene, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding.

A number of factors may impact the silicon, oxygen, and carbon concentration within the films. For example, in some embodiments, the produced film may be limited to or consist essentially of silicon, oxygen, carbon, and hydrogen, along with any trace materials, which may account for contaminants, for example. In some embodiments, the silicon concentration within the film may be maintained at less than or about 40%, which may help limit leakage current of the produced film, as a more silicon-rich film may be characterized by higher leakage. Accordingly, in some embodiments the produced material before or after an anneal as discussed below may be characterized by a silicon concentration of less than or about 38%, and may be maintained at less than or about 36%, less than or about 35%, less than or about 34%, less than or about 33%, less than or about 32%, less than or about 31%, less than or about 30%, less than or about 29%, less than or about 28%, less than or about 27%, less than or about 26%, less than or about 25%, or less.

The oxygen concentration within the film may be maintained below or about 55%, which may indicate the amount carbon and hydrogen that remain in the film after an anneal, where a lower oxygen content may indicate more carbon and hydrogen may be retained. Accordingly, in some embodiments the produced material before or after an anneal as discussed below may be characterized by an oxygen concentration of less than or about 54%, and may be maintained at less than or about 53%, less than or about 52%, less than or about 51%, less than or about 50%, less than or about 49%, less than or about 48%, less than or about 47%, less than or about 46%, less than or about 45%, less than or about 44%, less than or about 43%, less than or about 42%, less than or about 41%, less than or about 40%, less than or about 39%, less than or about 38%, less than or about 37%, less than or about 36%, less than or about 35%, less than or about 34%, less than or about 33%, less than or about 32%, less than or about 31%, less than or about 30%, or less.

The present technology may be able to tune a carbon incorporation within the film based on flow rates as will be discussed below. In embodiments of the present technology, carbon concentration may be included at between about 0% and about 30%, and may be characterized by a carbon concentration within the produced material before or after an anneal as discussed below of greater than or about 5%, greater than or about 10%, greater than or about 12%, greater than or about 14%, greater than or about 16%, greater than or about 18%, greater than or about 20%, greater than or about 22%, greater than or about 24%, greater than or about 26%, or higher.

Hydrogen incorporation in the film may impact one or more material properties, as well as the quality of the film produced. Although the carbon-containing precursor and/or the silicon-containing precursor may include hydrogen, in some embodiments no additional source of hydrogen may be provided. Although inert precursors or carrier gases may be provided with the silicon-containing precursor and the carbon-containing precursor, no other chemically reactive precursors may be delivered with the precursors in some embodiments. By limiting the hydrogen provided to the chamber to hydrogen included in the carbon-containing precursor and the silicon-containing precursor, an atomic ratio of hydrogen within the produced film may be lower than if hydrogen gas were additionally provided.

Film roughness may also be affected by the composition of the film, where the carbon-containing precursor may increase roughness. For example, longer chain hydrocarbons may contribute to increased film roughness in some embodiments. Roughness may be affected by a film thickness produced, and in some embodiments roughness characteristics may be for any film thickness including deposited thickness of less than or about 1,000 nm, and may be characteristic of films deposited to thicknesses of less than or about 500 nm, less than or about 250 nm, less than or about 100 nm, less than or about 50 nm, less than or about 20 nm, less than or about 10 nm, less than or about 5 nm, or less. For example, a root-mean-square roughness of deposited films may be less than or about 3.0 nm, and may be less than or about 2.5 nm, less than or about 2.0 nm, less than or about 1.5 nm, less than or about 1.0 nm, less than or about 0.9 nm, less than or about 0.8 nm, less than or about 0.7 nm, less than or about 0.6 nm, less than or about 0.5 nm, less than or about 0.4 nm, less than or about 0.3 nm, less than or about 0.2 nm, less than or about 0.1 nm, or less.

Leakage current and dielectric breakdown may be impacted by the atomic concentrations within the materials produced. However, by producing materials according to embodiments of the present technology, leakage current at 2 MV/cm may be maintained at less than or about $9.0E-9$ $A/cm^2$, and may be maintained at less than or about $8.0E-9$ $A/cm^2$, less than or about $7.0E-9$ $A/cm^2$, less than or about $6.0E-9$ $A/cm^2$, less than or about $5.0E-9$ $A/cm^2$, less than or about $4.0E-9$ $A/cm^2$, less than or about $3.0E-9$ $A/cm^2$, less than or about $2.0E-9$ $A/cm^2$, less than or about $1.0E-9$ $A/cm^2$, less than or about $9.0E-10$ $A/cm^2$, less than or about $8.0E-10$ $A/cm^2$, less than or about $7.0E-10$ $A/cm^2$, less than or about $6.0E-10$ $A/cm^2$, less than or about $5.0E-10$ $A/cm^2$, or less. Additionally, breakdown voltage of the film at 0.001 $A/cm^2$ may be maintained at greater than or about 6.0 MV/cm, and may be maintained at greater than or about 6.5 MV/cm, greater than or about 7.0 MV/cm, greater than or about 7.5 MV/cm, greater than or about 8.0 MV/cm, greater than or about 8.5 MV/cm, greater than or about 9.0 MV/cm, greater than or about 9.5 MV/cm, greater than or about 10.0 MV/cm, greater than or about 10.5 MV/cm, greater than or about 11.0 MV/cm, greater than or about 11.5 MV/cm, greater than or about 12.0 MV/cm, or higher.

To produce films characterized by lower dielectric constant while maintaining sufficient leakage and breakdown performance, the present technology may deliver the precursors to control atomic incorporation, and facilitate bonding between silicon and oxygen, as well as between silicon and carbon, which may increase film quality and performance. For example, at higher flow rates, increased carbon-hydrogen bonding may remain, or the carbon may bond around oxygen, which may then be more prone to outgassing from the film. Accordingly, flow rates of the silicon-containing precursor and the carbon-containing precursor may be maintained low to ensure increased bonding may occur between the carbon and silicon. For example, in some embodiments, a flow rate of the carbon-containing precursor may be maintained at less than or about 250 sccm, and may be maintained at less than or about 200 sccm, less than or about 150 sccm, less than or about 100 sccm, less than or about 90 sccm, less than or about 80 sccm, less than or about 70 sccm, less than or about 60 sccm, less than or about 50 sccm, less than or about 40 sccm, less than or about 30 sccm, less than or about 20 sccm, less than or about 10 sccm, or less. By maintaining the carbon-containing precursor flow rate sufficiently low, improved carbon-to-silicon bonding may occur, which may limit shrinkage and outgassing during subsequent anneal processing. For example, as the carbon-containing precursor flow rate increases above 100 sccm or more, increased dangling bonds may be incorporated within the film, and annealing the film may further reduce carbon and hydrogen incorporation, which may push dielectric constant higher. Accordingly, by maintaining lower flow rates of the carbon-containing precursor, dielectric constant may be further reduced. This may also help maintain a higher breakdown voltage of the film produced.

Similarly, maintaining a lower silicon-containing precursor flow rate may help control silicon incorporation, which can otherwise increase film leakage with more silicon-silicon bonding. Hence, in some embodiments of the present technology the flow rate of the silicon-containing precursor may be maintained at less than or about 100 sccm, and may be maintained at less than or about 95 sccm, less than or about 90 sccm, less than or about 85 sccm, less than or about 80 sccm, less than or about 75 sccm, less than or about 70 sccm, less than or about 65 sccm, less than or about 60 sccm, less than or about 55 sccm, less than or about 50 sccm, less than or about 45 sccm, less than or about 40 sccm, less than or about 35 sccm, less than or about 30 sccm, less than or about 25 sccm, less than or about 20 sccm, less than or about 15 sccm, less than or about 10 sccm, less than or about 5 sccm, or less.

Providing the precursors at certain ratios to one another may also facilitate control of the film formation to produce the properties and characteristics previously described. For example, in some embodiments the flow rate of the carbon-containing precursor may be maintained higher than the silicon-containing precursor, which may help reduce the dielectric constant and leakage properties. Hence, in some embodiments the flow rate ratio of the carbon-containing precursor to the silicon-containing precursor may be maintained at greater than or about 1:1, and may be maintained at greater than or about 2:1, greater than or about 3:1, greater than or about 4:1, greater than or about 5:1, greater than or about 6:1, greater than or about 7:1, or higher. Additionally, the flow rate of the oxygen-containing precursor may be maintained higher than either of the silicon-containing precursor or the carbon-containing precursor, which may facilitate growth of a material characterized by increased silicon-oxygen and silicon-carbon bonding. In some embodiments, a flow rate ratio of the oxygen-containing precursor to either of the other precursors may be maintained at greater than or about 10:1, and may be maintained at greater than or about 25:1, greater than or about 50:1, greater than or about 75:1, greater than or about 100:1, greater than or about 125:1, greater than or about 150:1, greater than or about 175:1, greater than or about 200:1, greater than or about 300:1, greater than or about 400:1, greater than or about 500:1, greater than or about 600:1, greater than or about 700:1, greater than or about 800:1, greater than or about 900:1, greater than or about 1000:1, or higher.

Silicon-and-oxygen-and-carbon materials produced by the present technology may be used in a number of structures, and may be included as materials used in integration, which may be maintained or removed after subsequent processing has been performed, which may include an anneal at a downstream process at optional operation 225, which may exceed temperatures of 700° C., and may be performed at temperatures of greater than or about 750° C., greater than or about 800° C., greater than or about 850° C., or higher. Because of the improved film bonding and growth produced by some embodiments of the present technology, the low-k materials may be less damaged by the anneal process, affording additional integration operations for low-k materials. For example, during many silicon oxycarbide film formations, the carbon may form about the oxygen, which may increase loss of carbon and hydrogen in an anneal. By performing depositions according to embodiments of the present technology in which improved silicon-carbon bonding may be performed, the carbon may be better retained during an anneal.

Although the produced materials may be impacted by an anneal, the present technology may produce films characterized by lower dielectric constant before or subsequent an anneal, and may produce materials characterized by a dielectric constant of less than or about 4.2, and may be characterized by a dielectric constant of less than or about 4.1, less than or about 4.0, less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, less than or about 2.7, or lower. Additionally, materials produced according to embodiments of the present technology may have the dielectric constant increase after an anneal as noted above by less than or about 1.0, and may have the dielectric constant increase by less than or about 0.9, less than or about 0.8, less than or about 0.7, less than or about 0.6, less than or about 0.5, less than or about 0.4, less than or about 0.3, less than or about 0.2, less than or about 0.1, or the dielectric constant may substantially or essentially remain consistent after an anneal.

The incorporation of carbon in this way may improve etch selectivity of the material relative to other oxide materials, including thermal oxide. For example, in some embodiments after formation of the silicon-and-oxygen-and-carbon material and subsequent material processing, the material may be removed in optional operation 230. In some embodiments, an in situ plasma may be formed of a halogen-containing and/or oxygen-containing precursor within the processing region of the chamber. Additionally, in some embodiments, a wet etch may be performed. For example, a dilute hydrogen fluoride or other wet etch may be performed in some embodiments. When carbon is incorporated within the film according to some embodiments of the present technology, the material may etch at a ratio relative to a thermal oxide of less than or about 1:1, and may etch at a ratio of less than or about 0.8:1, less than or about 0.6:1, less than or about 0.4:1, less than or about 0.2:1, less than or about 0.1:1, less than or about 0.5:1, less than or about 0.1:1, less than or about 0.05:1, less than or about 0.01:1, or less.

Figure 3:
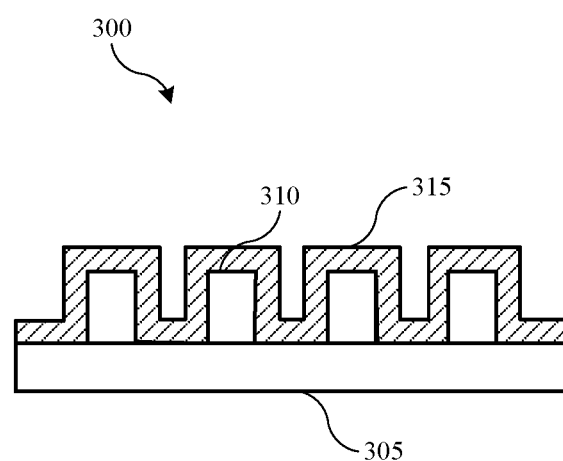
FIG. 3 shows an exemplary material layer produced according to some embodiments of the present technology.

As explained previously, in some embodiments the thermally based material formation may provide more conformal films, which may operate as a liner, spacer, or other material used during semiconductor processing. FIG. 3 shows an exemplary deposition produced according to some embodiments of the present technology. For example, a substrate 305 may have a material 310 formed, or may have a number of features formed through the substrate, which may produce a high-aspect-ratio structure. In some embodiments of the present technology, a silicon-and-oxygen-and-carbon film 315 may be formed over the structure as illustrated. It is to be understood that this example is not intended to be limiting, as the present technology may be utilized in any number of processing operations. Formation of the film may occur based on methods previously described.

The aspect ratio of the features, or the ratio of the depth of the feature relative to the width or diameter of the feature formed during the etch, may be greater than or about 10:1, and may be greater than or about 15:1, greater than or about 20:1, greater than or about 25:1, greater than or about 30:1, greater than or about 35:1, greater than or about 40:1, greater than or about 45:1, greater than or about 50:1, or more. A plasma-deposited layer may be incapable of accessing deeper within the trench, and pinch off may occur at the top of the feature. However, silicon-and-oxygen-and-carbon films produced by the present technology may be characterized by coverage fully through the structure as illustrated. For example, a thickness of the film along sidewalls nearer the top of the structure and a thickness of the film along sidewalls nearer the bottom of the structure may be substantially the same, where the film produced is substantially conformal. Accordingly, in some embodiments the film deposited may be characterized by a conformality or a similarity of thickness formed between any two regions along a sidewall or base of a feature or along the film formed of greater than or about 80%. In some embodiments, the conformality may be greater than or about 85%, greater than or about 90%, greater than or about 92%, greater than or about 94%, greater than or about 96%, greater than or about 98%, or higher. Accordingly, the present technology may produce low-k films that may be incorporated in a number of semiconductor processes for which conformality and improved electrical characteristics may be achieved.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a silicon-containing precursor and an oxygen-containing precursor to a processing region of a semiconductor processing chamber, wherein a substrate is disposed within the processing region of the semiconductor processing chamber;
   providing a carbon-containing precursor to the processing region of the semiconductor processing chamber, wherein the carbon-containing precursor is characterized by a carbon-carbon double bond or a carbon-carbon triple bond;
   thermally reacting the silicon-containing precursor, the oxygen-containing precursor, and the carbon-containing precursor at a temperature below about 650° C.; and
   forming a silicon-and-oxygen-and-carbon-containing layer on the substrate.

2. The semiconductor processing method of claim 1, wherein the processing region of the semiconductor processing chamber is maintained plasma-free while forming the silicon-and-oxygen-and-carbon-containing layer on the substrate.

3. The semiconductor processing method of claim 1, wherein the silicon-and-oxygen-and-carbon-containing layer consists essentially of silicon, oxygen, carbon, and hydrogen.

4. The semiconductor processing method of claim 1, wherein the substrate is characterized by one or more features, and wherein the silicon-and-oxygen-and-carbon-containing layer is formed about the one or more features with a conformality of greater than or about 90%.

5. The semiconductor processing method of claim 1, wherein thermally reacting the silicon-containing precursor, the oxygen-containing precursor, and the carbon-containing precursor is performed at a temperature below or about 500° C.

6. The semiconductor processing method of claim 1, wherein the silicon-and-oxygen-and-carbon-containing layer is characterized by a carbon concentration of greater than or about 20%, and wherein the silicon-and-oxygen-and-carbon-containing layer is characterized by a root-mean-square roughness of less than or about 0.4 nm.

7. The semiconductor processing method of claim 6, wherein the silicon-and-oxygen-and-carbon-containing layer is characterized by a leakage current at 2 MV/cm of less than or about 5E-9 A/cm$^2$.

8. The semiconductor processing method of claim 1, further comprising:
   exposing the silicon-and-oxygen-and-carbon-containing film to an anneal at a temperature of greater than or about 750° C.

9. The semiconductor processing method of claim 8, wherein, subsequent the anneal, the silicon-and-oxygen-and-carbon-containing layer maintains a dielectric constant of less than or about 4.2.

10. The semiconductor processing method of claim 1, wherein the carbon-containing precursor is provided at a flow rate ratio to the silicon-containing precursor of greater than or about 2:1.

11. The semiconductor processing method of claim 10, wherein the oxygen-containing precursor is provided at a flow rate ratio to the carbon-containing precursor of greater than or about 10:1.

12. A semiconductor processing method comprising:
   providing a silicon-containing precursor and an oxygen-containing precursor to a processing region of a semiconductor processing chamber, wherein a substrate is disposed within the processing region of the semiconductor processing chamber;
   providing a hydrocarbon to the processing region of the semiconductor processing chamber, wherein the hydrocarbon is characterized by a carbon-carbon double bond or a carbon-carbon triple bond;
   thermally reacting the silicon-containing precursor, the oxygen-containing precursor, and the hydrocarbon at a temperature between about 400° C. and about 600° C.; and
   forming a silicon-and-oxygen-and-carbon-containing layer on the substrate.

13. The semiconductor processing method of claim 12, wherein the processing region of the semiconductor processing chamber is maintained plasma-free during the semiconductor processing method.

14. The semiconductor processing method of claim 12, further comprising:
   exposing the silicon-and-oxygen-and-carbon-containing film to an anneal at a temperature of greater than or about 750° C.

15. The semiconductor processing method of claim 14, wherein, subsequent the anneal, the silicon-and-oxygen-and-carbon-containing layer maintains a dielectric constant of less than or about 4.2.

16. The semiconductor processing method of claim 12, wherein the hydrocarbon is provided at a flow rate ratio to the silicon-containing precursor of greater than or about 2:1.

17. The semiconductor processing method of claim 12, wherein the substrate is characterized by one or more features, and wherein the silicon-and-oxygen-and-carbon-containing layer is formed about the one or more features with a conformality of greater than or about 90%.

18. A semiconductor processing method comprising:
providing a silicon-containing precursor and an oxygen-containing precursor to a processing region of a semiconductor processing chamber, wherein a substrate is disposed within the processing region of the semiconductor processing chamber, and wherein the oxygen-containing precursor is provided at a flow rate ratio to the silicon-containing precursor of greater than or about 10:1;
providing a carbon-containing precursor to the processing region of the semiconductor processing chamber, wherein the carbon-containing precursor is characterized by a carbon-carbon double bond or a carbon-carbon triple bond;
thermally reacting the silicon-containing precursor, the oxygen-containing precursor, and the carbon-containing precursor at a temperature below about 600° C.; and
forming a silicon-and-oxygen-and-carbon-containing layer on the substrate, wherein the silicon-and-oxygen-and-carbon-containing layer consists essentially of silicon, oxygen, carbon, and hydrogen.

19. The semiconductor processing method of claim 18, wherein the processing region of the semiconductor processing chamber is maintained plasma-free while forming the silicon-and-oxygen-and-carbon-containing layer on the substrate.

20. The semiconductor processing method of claim 18, wherein the silicon-and-oxygen-and-carbon-containing layer is characterized by a thickness conformality of greater than or about 90%.

* * * * *